US006660561B2

(12) United States Patent
Forthun et al.

(10) Patent No.: US 6,660,561 B2
(45) Date of Patent: *Dec. 9, 2003

(54) METHOD OF ASSEMBLING A STACKABLE INTEGRATED CIRCUIT CHIP

(75) Inventors: John A. Forthun, Glendora, CA (US); Mark G. Gordon, Corona Del Mar, CA (US)

(73) Assignee: DPAC Technologies Corp., Garden Grove, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/202,185

(22) Filed: Jul. 24, 2002

(65) Prior Publication Data

US 2002/0185724 A1 Dec. 12, 2002

Related U.S. Application Data

(62) Division of application No. 09/594,989, filed on Jun. 15, 2000, now abandoned.

(51) Int. Cl.[7] .................. H01L 21/44; H01L 21/48; H01L 21/50
(52) U.S. Cl. ........................................................ 438/109
(58) Field of Search ................................. 438/107, 109

(56) References Cited

U.S. PATENT DOCUMENTS

| 3,746,931 | A |   | 7/1973  | Stein            |         |
|-----------|---|---|---------|------------------|---------|
| 4,956,694 | A |   | 9/1990  | Eide             |         |
| 5,128,831 | A |   | 7/1992  | Fox, III et al.  |         |
| 5,198,888 | A |   | 3/1993  | Sugano et al.    |         |
| 5,231,304 | A |   | 7/1993  | Solomon          |         |
| 5,239,447 | A |   | 8/1993  | Cotues et al.    |         |
| 5,311,401 | A |   | 5/1994  | Gates, Jr. et al.|         |
| 5,313,096 | A |   | 5/1994  | Eide             |         |
| 5,373,189 | A |   | 12/1994 | Massit et al.    |         |
| 5,375,041 | A | * | 12/1994 | McMahon          | 361/749 |
| 5,384,689 | A |   | 1/1995  | Shen             |         |
| 5,514,907 | A |   | 5/1996  | Moshavedi        |         |
| 5,612,570 | A |   | 3/1997  | Eide             |         |
| 5,712,767 | A |   | 1/1998  | Koizumi          |         |
| 5,731,633 | A |   | 3/1998  | Clayton          |         |
| 5,818,106 | A |   | 10/1998 | Kunimatsu        |         |
| 5,869,353 | A |   | 2/1999  | Levy et al.      |         |
| 5,869,896 | A |   | 2/1999  | Baker et al.     |         |
| 6,205,654 | B1| * | 3/2001  | Burns            | 29/830  |
| 6,323,060 | B1| * | 11/2001 | Isaak            | 438/109 |
| 6,426,240 | B2| * | 7/2002  | Isaak            | 438/106 |
| 6,473,308 | B2| * | 10/2002 | Forthun          | 361/749 |

FOREIGN PATENT DOCUMENTS

| JP | 60194548 | 10/1985 |
| JP |  4209562 |  7/1992 |

* cited by examiner

*Primary Examiner*—Wael Fahmy
*Assistant Examiner*—Howard Weiss
(74) *Attorney, Agent, or Firm*—Stetina Brunda Garred & Brucker

(57) ABSTRACT

A stackable integrated circuit chip package comprising a carrier and a flex circuit. The flex circuit itself comprises a flexible substrate having opposed top and bottom surfaces, and a conductive pattern which is disposed on the substrate. The chip package further comprises an integrated circuit chip which is electrically connected to the conductive pattern. The substrate is wrapped about and attached to at least a portion of the carrier such that the conductive pattern defines first and second portions which are each electrically connectable to another stackable integrated circuit chip package. The carrier is sized and configured to be releasably attachable to the carrier of at least one other identically configured stackable integrated circuit chip package in a manner wherein the chip packages, when attached to each other, are maintained in registry along first and second axes which are generally co-planar and extend in generally perpendicular relation to each other.

6 Claims, 3 Drawing Sheets

METHOD OF ASSEMBLING A STACKABLE INTEGRATED CIRCUIT CHIP

CROSS-REFERENCE TO RELATED APPLICATIONS

This is a divisional patent application of application Ser. No. 09/594,989 filed on Jun. 15, 2000 now abandoned.

STATEMENT RE: FEDERALLY SPONSORED RESEARCH/DEVELOPMENT (Not Applicable)

BACKGROUND OF THE INVENTION

The present invention relates generally to chip stacks, and more particularly to a stackable integrated circuit chip package including a flex circuit and a carrier which allows multiple chip packages to be quickly, easily and inexpensively mechanically registered and interconnected or assembled into a chip stack having a minimal profile.

Multiple techniques are currently employed in the prior art to increase memory capacity on a printed circuit board. Such techniques include the use of larger memory chips, if available, and increasing the size of the circuit board for purposes of allowing the same to accommodate more memory devices or chips. In another technique, vertical plug-in boards are used to increase the height of the circuit board to allow the same to accommodate additional memory devices or chips.

Perhaps one of the most commonly used techniques to increase memory capacity is the stacking of memory devices into a vertical chip stack, sometimes referred to as 3D packaging or Z-Stacking. In the Z-Stacking process, from two (2) to as many as eight (8) memory devices or other integrated circuit (IC) chips are interconnected in a single component (i.e., chip stack) which is mountable to the "footprint" typically used for a single package device such as a packaged chip. The Z-Stacking process has been found to be volumetrically efficient, with packaged chips in TSOP (thin small outline package) or LCC (leadless chip carrier) form generally being considered to be the easiest to use in relation thereto. Though bare dies or chips may also be used in the Z-Stacking process, such use tends to make the stacking process more complex and not well suited to automation.

In the Z-Stacking process, the IC chips or packaged chips must, in addition to being formed into a stack, be electrically interconnected to each other in a desired manner. There is known in the prior art various different arrangements and techniques for electrically interconnecting the IC chips or packaged chips within a stack. Examples of such arrangements and techniques are disclosed in Applicant's U.S. Pat. No. 4,956,694 entitled INTEGRATED CIRCUIT CHIP STACKING issued Sep. 11, 1990, U.S. Pat. No. 5,612,570 entitled CHIP STACK AND METHOD OF MAKING SAME issued Mar. 18, 1997, and U.S. Pat. No. 5,869,353 entitled MODULAR PANEL STACKING PROCESS issued Feb. 9, 1999.

The various arrangements and techniques described in these issued patents and other currently pending patent applications of Applicant have been found to provide chip stacks which are relatively easy and inexpensive to manufacture, and are well suited for use in a multitude of differing applications. The present invention provides yet a further alternative arrangement and technique for forming a chip stack which involves the use of stackable integrated circuit chip packages including flex circuits and carriers. The inclusion of the carriers in the chip packages of the present invention provides numerous advantages in the assembly of the chip stack, including significantly greater ease in achieving and maintaining the registry or alignment between the chip packages within the stack. Additionally, the use of the carriers significantly simplifies the interconnection or assembly of the chip packages into a chip stack.

BRIEF SUMMARY OF THE INVENTION

In accordance with the present invention, there is provided a stackable integrated circuit chip package which comprises a carrier and a flex circuit. The flex circuit itself comprises a flexible substrate having opposed, generally planar top and bottom surfaces. Disposed on the flex circuit is a conductive pattern. Also included in the chip package is an integrated circuit chip which is electrically connected to the conductive pattern. The substrate is wrapped about and attached to at least a portion of the carrier such that the conductive pattern defines first and second portions which are each electrically connectable to another stackable integrated circuit chip package.

In the chip package of the present invention, the carrier is sized and configured to be releasably attachable to the carrier of at least one other identically configured stackable integrated circuit chip package in a manner wherein the chip packages, when attached to each other, are maintained in registry along first and second axes which are generally co-planar and extend in generally perpendicular relation to each other. The carrier of the chip package has a generally rectangular top section which defines inner and outer surfaces and opposed pairs of longitudinal and lateral sides. In addition to the top section, the carrier includes a pair of identically configured side rail sections which extend along respective ones of the lateral sides of the top section. In the chip package, the substrate is wrapped about the carrier such that the first portion of the conductive pattern extends over a portion of the integrated circuit chip and the second portion of the conductive pattern extends over a portion of the outer surface of the top section. More particularly, the substrate itself preferably has a generally rectangular configuration defining a pair of longitudinal peripheral edge segments and a pair of lateral peripheral edge segments. In addition to being disposed upon a portion of the top surface of the substrate, the conductive pattern extends along the bottom surface of the substrate. The substrate is wrapped about the longitudinal sides of the top section of the carrier, and is sized relative to the carrier and the integrated circuit chip such that the lateral peripheral edge segments of the substrate extend along the outer surface of the top section in direct contact with each other.

The integrated circuit chip of the chip package of the present invention may be either a flip chip device or a BGA (ball grid array) device comprising a body having opposed, generally planar top and bottom surfaces. In addition to the body, the integrated circuit chip includes a plurality of conductive contacts which are disposed on the bottom surface of the body. The conductive contacts of the integrated circuit chip are electrically connected to the conductive pattern, and more particularly to that portion of the conductive pattern disposed on the top surface of the substrate. The electrical connection of the conductive contacts of the integrated circuit chip to the conductive pattern is preferably accomplished through the use of a Z-axis pad disposed between the bottom surface of the body and the top surface of the substrate. The integrated circuit chip of the chip package may also be a TSOP (thin small outline package) device comprising a body having opposed, generally planar top and bottom surfaces, an opposed pair of longitudinal sides, and an opposed pair of lateral sides. In addition to the body, this particular integrated circuit chip includes a plurality of conductive leads which protrude or extend from each of the longitudinal sides of the body. The conductive leads of the integrated circuit chip are electrically connected to the conductive pattern of the substrate of the flex circuit via the Z-axis pad.

In the chip package of the present invention, the substrate is preferably attached to the carrier through the use of an acrylic film adhesive. As will be recognized, portions of the top surface of the substrate adjacent respective ones of the lateral peripheral edge segments thereof are secured to a portion of the outer surface of the top section of the carrier through the use of the aforementioned adhesive. The substrate itself is preferably fabricated from a polyamide having a thickness in the range of from about 1 mil to 8 mils. The carrier may be injection molded from a rigid plastic material, and more particularly polycarbonate, or may alternatively be fabricated from a sheet metal material.

To facilitate the releasable attachment of the carrier of the chip package to the carrier of another identically configured stackable integrated circuit chip package, the carrier is preferably formed to include four attachment tabs which are integrally connected to the top section of the carrier and protrude upwardly from the outer surface thereof. The attachment tabs are preferably arranged in two pairs which are disposed along respective ones of the longitudinal sides of the top section in opposed relation to each other. In addition to the attachment tabs, the carrier preferably includes a pair of alignment slots which are disposed within the top section adjacent respective ones of the lateral sides thereof. Also included on the carrier is a pair of alignment tabs which protrude from respective ones of the side rail sections thereof in aligned relation to respective ones of the alignment slots.

The attachment tabs are engageable (i.e., mechanically interlockable) to respective ones of the side rail sections of the carrier of another stackable integrated circuit chip package, with the alignment tabs being releasably insertable into respective ones of the alignment slots of the carrier of another stackable integrated circuit chip package. Additionally, the alignment slots are adapted to receive respective ones of the alignment tabs of the carrier of another stackable integrated circuit chip package. In this respect, the mechanical interlock of the attachment tabs of the carrier to the side rail sections of the carrier of a chip package stacked thereupon maintains the chip packages in registry along the first axis, and more particularly maintains the second section of the conductive pattern of the lower chip package in registry or alignment along the first axis with the first portion of the conductive pattern of the upper chip package stacked thereupon. Additionally, the insertion of the alignment tabs of the carrier of the upper chip package into respective ones of the alignment slots of the carrier of the lower chip package maintains the stacked chip packages in registry along the second axis, and more particularly maintains the second portion of the conductive pattern of the lower chip package in registry along the second axis with the first portion of the conductive pattern of the upper chip package in the chip stack.

The chip package of the present invention is preferably used in combination with a base chip package which is similar in structure to the above-described chip package. The sole distinction between the base chip package and the chip package lies in the structure of the base carrier of the base chip package which differs from the carrier of the chip package in relation to the configuration of the side rail sections thereof. More particularly, the side rail sections of the base carrier do not each include one of the above-described attachment tabs, but rather are each formed to include a flange portion which extends laterally outward from the remainder thereof. The flange portions of the side rails sections of the base carrier are attachable to a mother board, and function as heat sinks. The releasable attachment of a chip package to a base chip package is accomplished in the same manner described above in relation to the releasable attachment of any two chip packages to each other. In this respect, the attachment tabs of the base carrier of the base chip package are engaged or mechanically interlocked to respective ones of the side rail sections of the chip package stacked thereupon, with the attachment tabs of such chip package being inserted into respective ones of the alignment slots of the base carrier of the base chip package. Advantageously, thermally conductive contact is achieved between the chip package and the base chip package due to the abutment of the side rail sections of the chip package to the top section of the base carrier, with such thermally conductive contact also being achieved between interconnected chip packages within the chip stack attributable to the abutment of the side rail sections of the carrier of a chip package to the outer surface of the top section of the carrier of the chip package immediately therebelow. The chip stack of the present invention may be constructed using any number of chip packages interconnected or mechanically interlocked to each other and to a base chip package.

BRIEF DESCRIPTION OF THE DRAWINGS

These, as well as other features of the present invention, will become more apparent upon reference to the drawings wherein.

DETAILED DESCRIPTION OF THE INVENTION

Figure 1:
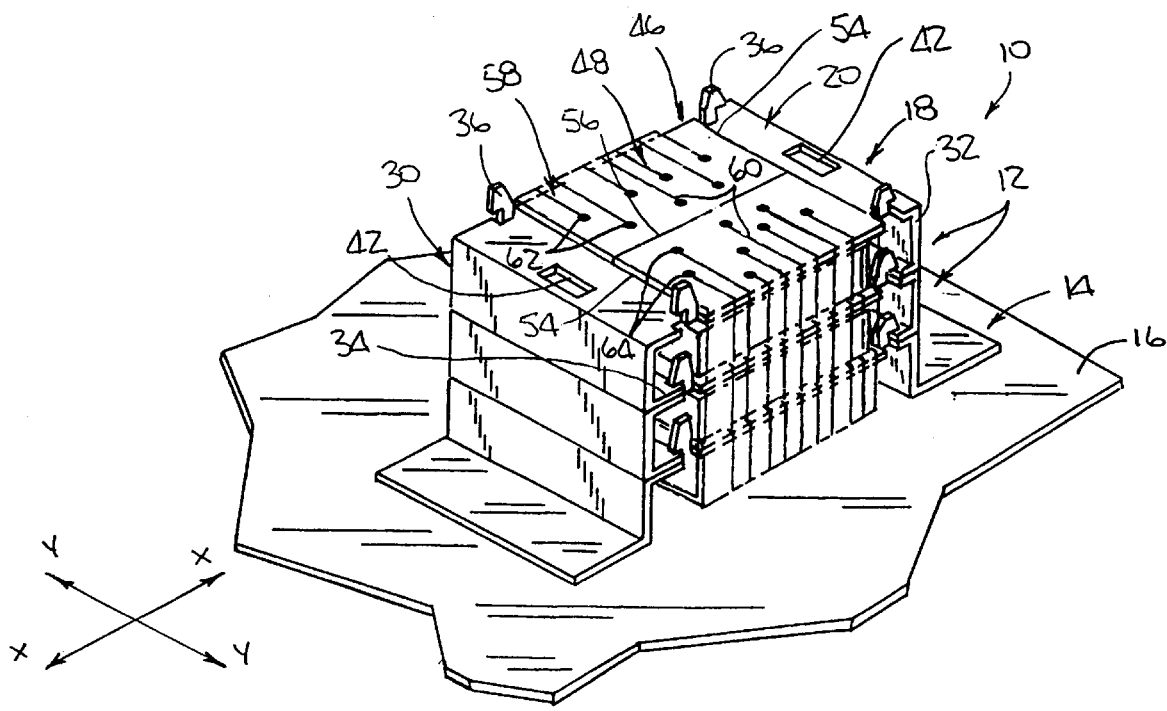
FIG. 1 is a top perspective view of a chip stack assembled using chip packages constructed in accordance with the present invention.

Referring now to the drawings wherein the showings are purposes of illustrating preferred embodiments of the present invention only, and not for purposes of limiting the same, FIG. 1 perspectively illustrates a chip stack 10 assembled through the use of two identically configured chip packages 12 which are stacked upon and releasably attached to each other, with one of the chip packages 12 itself being stacked upon and releasably attached to a base chip package 14. As will be discussed in more detail below, the chip packages 12 are electrically connected to each other, with the lowermost chip package 12 being electrically connected to the base chip package 14. The base chip package 14 is itself attached (i.e., electrically connected) to a mother board 16. The structural attributes of each chip package 12 and the base chip package 14 within the chip stack 10 will be discussed in detail below. Those of ordinary skill in the art will recognize that the chip stack 10 may be assembled to include fewer or greater than two chip packages 12 as shown in FIG. 1.

Figure 2:
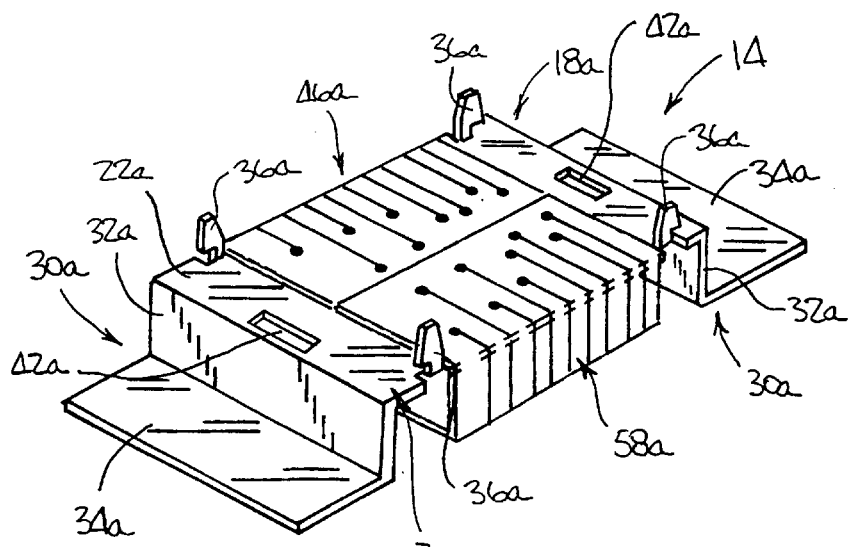
FIG. 2 is a top perspective view of the base chip package of the chip stack shown in FIG. 1.
Figure 3:
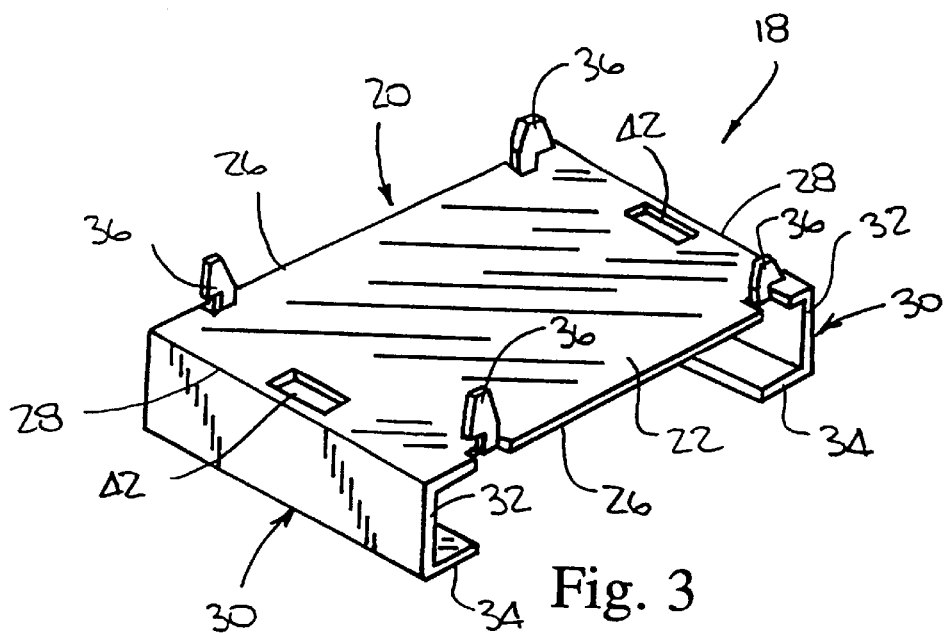
FIG. 3 is a top perspective view of the carrier included in each of the chip packages of the chip stack shown in FIG. 1 other than for the base chip package shown in FIG. 2.
Figure 4:
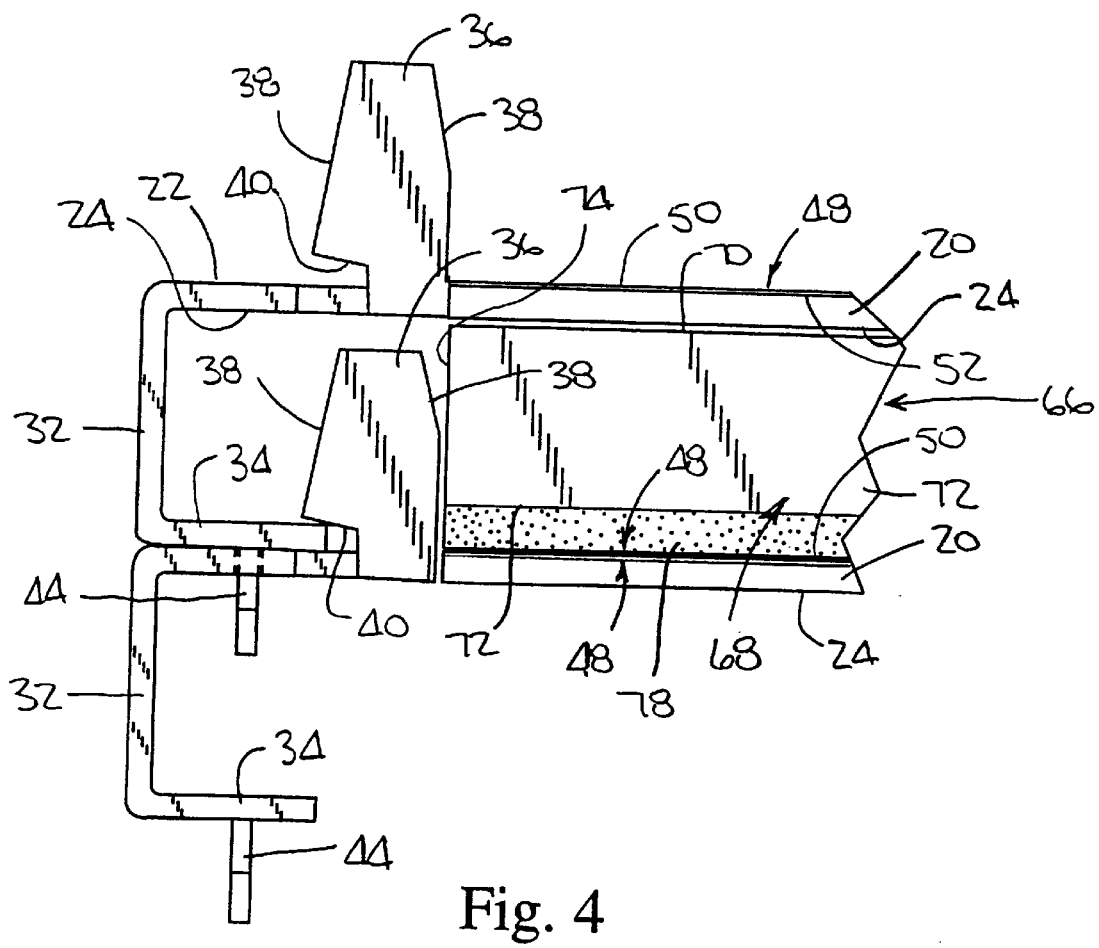
FIG. 4 is a side-elevational view illustrating the manner in which two chip packages which each include the carrier shown in FIG. 3 are mechanically connected to each other is assembling the chip stack shown in FIG. 1.

Referring now to FIGS. 2 and 3, each chip package 12 comprises a carrier 18 which includes a rectangularly configured top section 20 defining an outer surface 22, an inner surface 24 (as shown in FIG. 4), an opposed pair of longitudinal sides 26, and an opposed pair of lateral sides 28. In addition to the top section 20, the carrier 18 includes an identically configured pair of generally L-shaped side rail sections 30 which are integrally connected to the top section 20 and extend along respective ones of the lateral sides 28 thereof. Each of the side rail sections 30 includes a side portion 32 which extends in generally perpendicular relation to the top section 20, and a flange portion 34 which extends laterally inward from the corresponding side portion 32 in spaced, generally parallel relation to the top section 20 (i.e., in generally perpendicular relation to the corresponding side portion 32).

The carrier 18 further comprises four identically configured attachment tabs 36 which are integrally connected to the top section 20, and protrude or extend upwardly from the top section 20 in generally perpendicular relation to the outer surface 22 thereof. As best seen in FIG. 4, each of the attachment tabs 36 defines an opposed pair of tapered lead-in edge segments 38 and a tapered engagement edge 40. The use of the edge segments 38 and engagement edge 40 of each attachment tab 36 will be discussed below. The attachment tabs 36 are preferably arranged in two pairs which are disposed along respective ones of the longitudinal sides 26 of the top section 20 in opposed relation to each other.

In addition to the attachment tabs 36, the carrier 18 includes a pair of rectangularly configured alignment slots 42 which are disposed within the top section 20 in close proximity to respective ones of the lateral sides 28 thereof. The alignment slots 42 are preferably oriented such that they would be bisected by a longitudinal axis extending equidistantly between the longitudinal sides 26 of the top section 20. The carrier 18 further includes an identically configured pair of alignment tabs 44 which are integrally connected to and protrude or extend downwardly from respective ones of the flange portions 34 of the side rail sections 30. The alignment tabs 44 have configurations which are complimentary to the alignment slots 42, and are positioned upon the flange portions 34 so as to be in registry or alignment with respective ones of the alignment slots 42. The manner in which the attachment tabs 36, alignment slots 42 and alignment tabs 44 are used to facilitate the interconnection of two chip packages 12 to each other will be discussed in more detail below. The carrier 18 may be injection molded from a rigid plastic material such as polycarbonate, or may alternatively be formed from a sheet metal material. The preferred wall thickness of the carrier 18 is in the range from about 0.004 inches to about 0.010 inches. The use of metal to fabricate the carrier 18 provides heat dissipation properties. In the case of sheet metal forming, the same is preferably accomplished by photo-etching the retention features (i.e., attachment tabs 36, alignment slots 42, alignment tabs 44) in the carrier 18.

In addition to the carrier 18, the chip package 12 includes a flex circuit 46. The flex circuit 46 itself comprises a flexible substrate 48 which, prior to being wrapped about the carrier 18 in a manner which will be described in more detail below, has a generally rectangular configuration defining a generally planar top surface 50, a generally planar bottom surface 52, an opposed pair of longitudinal peripheral edge segments 54, and an opposed pair of lateral peripheral edge segments 56. The substrate 48 is preferably fabricated from a polyamide which has a thickness of several mils or less, and may have a thickness down to about 1 mil.

Disposed on the substrate 48 is a conductive pattern 58 of the flex circuit 46. The conductive pattern 58 comprises a first set of conductive pads (not shown) which are disposed on the bottom surface 52 of the substrate 48. In addition to the pads of the first set, the conductive pattern comprises a plurality of conductive traces 60 which extend along the bottom surface 52 of the substrate 48 from respective ones of the pads of the first set to respective ones of the pads 62 of a second set and the pads 64 of a third set. As such, the conductive traces 60 are segregated into two sets, with the traces 60 of one set extending to respective ones of the pads 62 of the second set, and the remaining set of traces 60 extending to respective ones of the pads 64 of the third set.

In addition to the first set of pads and the pads 62, 64 of the second and third sets, the conductive pattern 58 of the flex circuit 46 comprises a fourth set of pads (not shown) which is disposed on the top surface 50 for the substrate 48 and electrically connected to respective ones of the pads of the first set. The pads of the fourth set are preferably arranged in an identical pattern to the pads of the first set such that the pads of the fourth set are aligned with and electrically connected to respective ones of the pads of the first set. Though not shown, the electrical connection of the pads of the first and fourth sets to each other is preferably accomplished through the use of vias which are formed in the substrate 48 and extend between respective aligned pairs of the pads of the first and fourth sets.

The pads of the first and fourth sets and the pads 62, 64 of the second and third sets, as well as the traces 60, are each preferably fabricated from very thin copper having a thickness in the range of from about 5 microns to about 25 microns through the use of conventional etching techniques. Advantageously, the use of thin copper for the various pads and traces 60 allows for etching line widths and spacings down to a pitch of about 4 mils which substantially increases the routing density on the flex circuit 46.

The chip package 12 of the first embodiment further comprises an integrated circuit chip 66 which may comprise a flip chip device or a fine pitch BGA (ball grid array) device. In the chip package 12, the integrated circuit chip 66 is electrically connected to the pads of the fourth set, and hence to the remainder of the conductive pattern 58. The integrated circuit chip 66 includes a rectangularly configured body 68 defining a generally planar top surface 70, a generally planar bottom surface 72, an opposed pair of longitudinal sides 74, and an opposed pair of lateral sides 76. Disposed on the bottom surface 72 of the body 68 are a plurality of conductive contacts. The conductive contacts are preferably arranged in an identical pattern to each of the first and fourth sets of conductive pads, with the conductive contacts being electrically connected to respective ones of the pads of the fourth set. In the chip package 12, such electrical connection is preferably accomplished via a Z-axis pad 78 which is disposed between the bottom surface 72 of the body 68 and the central portion of the top surface 50 of the substrate 48.

In the chip package 12 of the present invention, the substrate 48 is wrapped about and attached to the carrier 18 such that the first set of pads defines a first portion of the conductive pattern 58 and the pads 62, 64 of the second and third sets collectively define a second portion of the conductive pattern 58, with the first and second portions each being electrically connectable to another chip package 12. More particularly, the substrate 48 is wrapped about the longitudinal sides 74 of the body 68 and the longitudinal sides 26 of the top section 20 such that the first and second portions of the conductive pattern 58 extend in spaced, generally parallel relation to each other, with the first portion extending over the Z-axis pad 78 and the second portion extending over a portion of the outer surface 22 of the top section 20.

The substrate 48 is preferably sized relative to the carrier 18 and the integrated circuit chip 66 such that the lateral peripheral edge segments 56 of the substrate 48 extend along the outer surface 22 of the top section 20 in generally parallel relation to each other and are either in direct contact with each other or separated by a narrow gap. Though as shown in FIG. 4, a slight gap is defined between the top surface 70 of the body 68 and the inner surface 24 of the top section 20, it is contemplated that the Z-axis pad 78 may be sized to have a thickness such that in the chip package 12, the body 68 of the integrated circuit chip 66, and in particular the top surface 70 thereof, is biased into direct, abutting contact with the inner surface 24 of the top section 20. In the chip package 12, the substrate 48 is preferably attached to the integrated circuit chip 66 and carrier 18 through the use of an acrylic film adhesive. In this respect, end portions of the top surface 50 of the substrate 48 adjacent respective ones of the lateral peripheral edge segments 56 thereof are secured to the longitudinal sides 74 of the body 68 and to a portion of the outer surface 22 of the top section 20 through the use of such adhesive.

Having thus described the structural attributes of a chip package 12, the preferred method of releasably attaching or mechanically interlocking the carriers 18 of two chip packages 12 to each other will now be described with particular reference to FIGS. 1 and 4. More particularly, an upper chip package 12 is oriented relative to a lower chip package 12 such that the alignment pads 44 of the carrier 18 of the upper chip package 12 are in registry or alignment with respective ones of the alignment slots 42 of the carrier 18 of the lower chip package 12. Thereafter, the upper and lower chip packages 12 are moved toward each other such that the attachment tabs 36 of the lower chip package 12 are mechanically interlocked or "snap-fit" to respective ones of the flange portions 34 of the side rail sections 30 of the upper chip package 12. The engagement of the attachment tabs 36 to the side rail sections 30 is assisted by the tapered lead-in edge segments 38 of the attachment tabs 36. As the attachment tabs 36 are being advanced along respective ones of the flange portions 34, the alignment tabs 34 of the carrier 18 of the upper chip package 12 are inserted or advanced into respective ones of the alignment slots 42 of the carrier 18 of the lower chip package 12. Such advancement is continued until such time as the engagement edges 40 of the attachment tabs 36 are brought into biased contact with respective ones of the flange portions 34 of the side rail sections 30.

As best seen in FIG. 4, upon the releasable attachment of the carriers 18 of the upper and lower chip packages 12 to each other in the above-described manner, the flange portions 34 of the side rail sections 30 of the carrier 18 of the upper chip package 12 are in abutting, thermally conductive contact with the top section 20 of the carrier 18 of the lower chip package 12, and in particular the outer surface 22 of the top section 20. Additionally, the first portion of the conductive pattern 58 of the upper chip package 12 is maintained in registry or alignment with the second portion of the conductive pattern 58 of the lower chip package 12 along a first axis X and second axis Y (shown in FIG. 1) which are generally co-planar and extend in generally perpendicular relation to each other. In this respect, the engagement or mechanical interlock of the attachment tabs 36 of the carrier 18 of the lower chip package 12 to the side rail sections 30 of the carrier 18 of the upper chip package 12 maintains the first and second portions of the respective conductive patterns 58 in registry along the first axis X, with the receipt of the alignment tabs 44 of the carrier 18 of the upper chip package 12 into the alignment slots 42 of the carrier 18 of the lower chip package 12 maintaining the first and second portions of the respective conductive patterns 58 in registry along the second axis Y. Advantageously, such registry is facilitated by the retaining features of the chip packages 12 (i.e., the attachment tabs 36, alignment slots 42, alignment tabs 44) insures accurate placement of the carriers 18 relative to each other as allows for the proper electrical connection between the first portion of the conductive pattern 58 of the upper chip package 12 and the second portion of the conductive pattern 58 of the lower chip package 12, such electrical connection preferably being accomplished through the use of solder. The detachment or separation of the chip packages 12 from each other may be accomplished through the use of a screwdriver.

As indicated above, the chip stack 10, in addition to including one or more chip packages 12, also includes the base chip package 14 which is perspectively illustrated in FIG. 2. The base chip package 14 is similar in structure to the above-described chip package 12. In this respect, the sole distinction between the base chip package 14 and the chip package 12 lies in the structure of the base carrier 18*a* of the base chip package 14 which differs from the carrier 18 of the chip package 12. More particularly, this difference in structure pertains to the configuration of the side rail sections 30*a* of the carrier 18*a* which, rather than including the inwardly extending flange portions 34 described above, each include a flange portion 34*a* which extends laterally outward from the corresponding side portion 32*a*. The releaseable attachment of a chip package 12 to the base chip package 14 is accomplished in the same manner as described above in relation to the releaseable attachment of two chip packages 12 to each other. In this respect, the attachment tabs 36*a* of the base carrier 18*a* of the base chip package 14 are engaged or mechanically interlocked to respective ones of the side rail sections 30 (i.e., flange portions 34 of the side rail sections 30) of the carrier 18 of the chip package 12 stacked thereupon, with the attachment tabs 36 of such chip package 12 being inserted into respective ones of the alignment slots 42*a* of the carrier 18*a* of the base chip package 14. Upon the snap-fit of the carrier 18 of the chip package 12 to the carrier 18*a* of the base chip package 14, thermally conductive contact is also achieved between the same attributable to the abutment of the flange portions 34 of the side rail sections 30 of the carrier 18 to the outer surface 22*a* of the top section 20*a* of the carrier 18*a*.

In the base chip package 14, the flex circuit 46*a* thereof is wrapped about and adhered to the carrier 18*a* in the same manner described above in relation to the attachment of the flex circuit 46 to the carrier 18. When the chip package 12 is snap-fit to the base chip package 14, the first portion of the conductive pattern 58 of the chip package 12 is maintained in registry with the second portion of the conductive pattern 58*a* of the base chip package 14 along the first and second axes X, Y in the above-described manner. As indicated above, when the chip stack 10 is assembled to include the base chip package 14 and one or more chip packages 12 stacked thereupon, the base chip package 14 may be electrically connected to a mother board 16, with such electrical connection typically being facilitated by soldering the first portion of the conductive pattern 58*a* of the base chip package 14 to corresponding conductive contacts on the mother board 16. The flange portions 34*a* of the side rail sections 30*a* of the carrier 18*a* may also be attached to the mother board 16 via soldering, riveting, or adhesive bonding, and further function as heat sinks for the chip stack 10.

Figure 5:
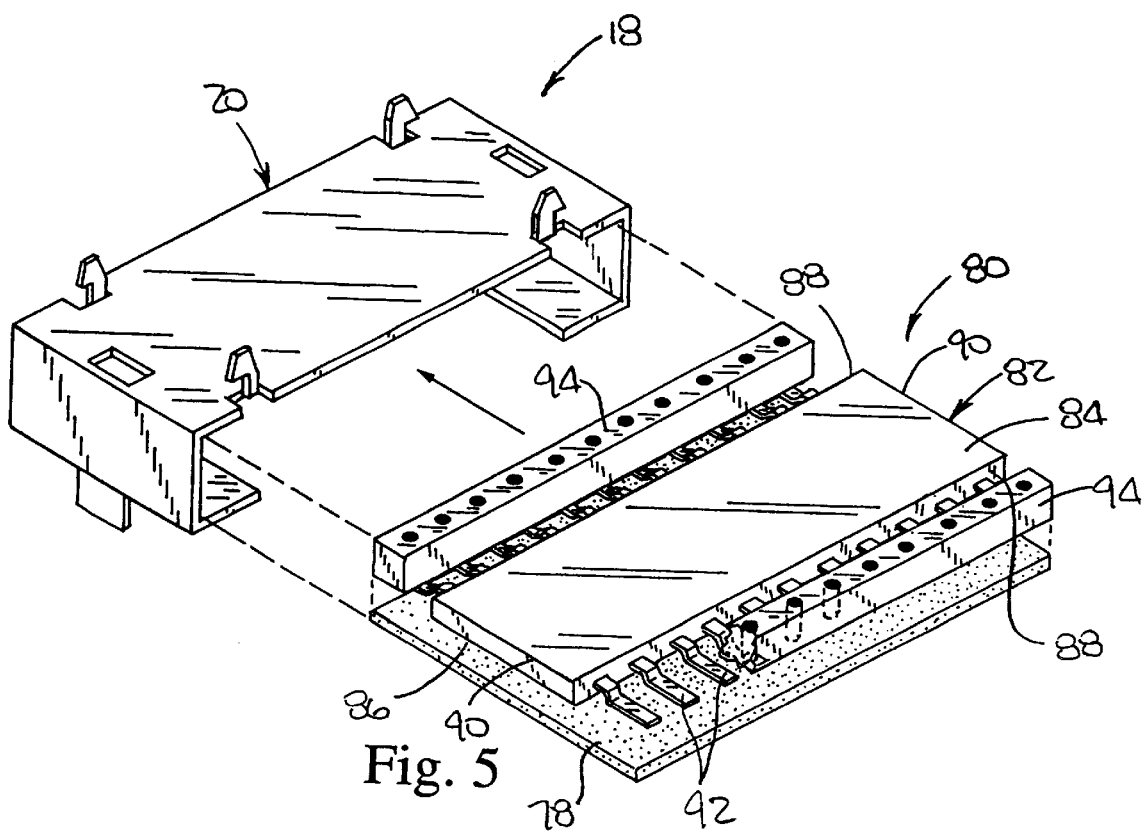
FIG. 5 is an exploded view illustrating a chip package constructed using an alternative integrated circuit chip.

Referring now to FIG. 5, rather than including the integrated circuit chip 66 which preferably comprises either a flip chip device or a BGA device, the chip package 12 may be assembled using an integrated circuit chip 80 which comprises a TSOP (thin small outline package) device. In this respect, the integrated circuit chip 80 comprises a rectangularly configured body 82 defining a generally planar top surface 84, a generally planar bottom surface 86, an opposed pair of longitudinal sides 88, and an opposed pair of lateral sides 90. Extending outwardly from each of the longitudinal sides 88 of the body 82 are a multiplicity of conductive leads 92. In the integrated circuit chip 80, a pair of rail members 94 may be electrically connected to the top surfaces of respective sets of the conductive leads 92, but are not used to establish electrical communication between two chip packages 12 or a chip package 12 and the base chip package 14. The conductive leads 92 of the integrated circuit chip 80 are electrically connected to the conductive pattern 58 of the flex circuit 46 via the above-described Z-axis pad 78. Due to the length of the body 82, the Z-axis pad 78 used in conjunction with the integrated circuit chip 80 is slightly longer than the Z-axis pad 78 used in conjunction with the integrated circuit chip 66. Similarly, the top section 20 of the carrier 18 used in conjunction with the integrated circuit chip 66 is slightly longer than the top section 20 of the carrier 18 used in conjunction with the integrated circuit chip 66.

Additional modifications and improvements of the present invention may also be apparent to those of ordinary skill in the art. For example, the carrier 18 may be formed to include one or more supplemental alignment tabs which are integrally connected to the top section 20 and protrude or extend upwardly from the outer surface 22 of the top section 20 in generally perpendicular relation thereto. These supplemental alignment tabs could be used to facilitate the proper alignment of the substrate 48 of the flex circuit 46 upon the outer surface 22 of the top section 20. Thus, the particular combination of parts described and illustrated herein is intended to represent only certain embodiments of the present invention, and is not intended to serve as limitations of alternative devices within the spirit and scope of the invention.

What is claimed is:

1. A method of assembling a stackable integrated circuit chip package, comprising the steps of:

(a) electrically connecting an integrated circuit chip to a conductive pattern on a flexible substrate of a flex circuit;

(b) interposing the chip and the conductive pattern portion which is electrically connected to the chip between opposed pair of side rail sections which are attached to a top section of a carrier; and (c) after step (b), wrapping the flex circuit about at least a portion of the carrier such that conductive pattern defines first and second portions which are each electrically connectable to another stackable integrated circuit chip package.

2. The method of claim 1 wherein the flexible substrate of the flex circuit defines a central portion and opposed end portions;

step (a) comprises positioning the integrated circuit chip over the central portion of the substrate; and step (c) comprises wrapping the end portions of the substrate about the carrier.

3. The method of claim 1 further comprising the step of:

(d) releasably attaching the carrier of at least one other identically configured stackable integrated circuit chip package to the carrier of the chip package in a manner wherein the chip packages, when attached to each other, are maintained in registry along first and second axes which are generally co-planar and extend in generally perpendicular relation to each other.

4. The method of claim 1 wherein step (a) is accomplished through the use of a z-axis pad.

5. The method of claim 3 further comprising the step of:

(e) securing the carrier and the flex circuit to each other.

6. The method of claim 4 wherein step (e) comprises adhesively affixing the end portions of the substrate to the carrier.

* * * * *